United States Patent [19]

Kawame et al.

[11] Patent Number: 4,963,828
[45] Date of Patent: Oct. 16, 1990

[54] PICTURE QUALITY TESTING METHOD AND APPARATUS FOR COLOR CATHODE-RAY TUBE

[75] Inventors: Keisuke Kawame; Toshio Asano, both of Yokohama; Jun Mochizuki, Yamato, all of Japan

[73] Assignee: Hitachi, Ltd., Tokyo, Japan

[21] Appl. No.: 309,361

[22] Filed: Feb. 13, 1989

[30] Foreign Application Priority Data

Mar. 4, 1988 [JP] Japan .................................. 63-49502
Apr. 5, 1988 [JP] Japan .................................. 63-82289

[51] Int. Cl.⁵ ........................................... G01R 31/24
[52] U.S. Cl. ..................................... 324/404; 358/10
[58] Field of Search ...................... 358/10, 29, 64, 65, 358/12; 324/404; 340/703

[56] References Cited

U.S. PATENT DOCUMENTS

| | | | |
|---|---|---|---|
| 2,657,254 | 10/1953 | Wintringham | 358/12 |
| 4,254,432 | 3/1981 | Nakahata | 358/10 |
| 4,602,272 | 7/1986 | Duschl | 324/404 |
| 4,706,108 | 11/1987 | Kumagai | 358/10 |
| 4,725,879 | 2/1988 | Eide et al. | 358/10 |
| 4,742,387 | 5/1988 | Oshima | 358/10 |
| 4,746,970 | 5/1988 | Hosokawa et al. | 358/10 |
| 4,797,619 | 1/1989 | Austin et al. | 324/404 |
| 4,814,858 | 3/1989 | Mochizuki et al. | 324/404 |
| 4,893,925 | 1/1990 | Sweeney et al. | 324/404 |

FOREIGN PATENT DOCUMENTS

| | | |
|---|---|---|
| 75766 | 10/1982 | Japan . |
| 0117889 | 6/1985 | Japan .................................. 358/10 |
| 0196095 | 10/1985 | Japan .................................. 358/10 |
| 0154392 | 7/1986 | Japan . |
| 0269024 | 11/1987 | Japan .................................. 358/10 |

Primary Examiner—John W. Shepperd
Assistant Examiner—James Juo
Attorney, Agent, or Firm—Antonelli, Terry, Stout & Kraus

[57] ABSTRACT

For the purpose of automated evaluation of white uniformity, the apparatus comprises a color television camera for picking up an image of white color displayed on the color cathode-ray tube, a circuit for separating color signals from the output signal of the color television camera, A/D converters for converting the analog color signals into digital color signals, memories for storing the digital color signals, and a computer for analyzing the contents of the memories. A nonuniform color portion is extracted from the color distribution of the display on the cathode-ray tube, and quantities of various features of the nonuniform color portion, for example, the hue, saturation and area of the nonuniform color portion and the degree of change in the saturation at the marginal edge contour of the nonuniform color portion are calculated by the computer to provide parameters used for evaluation of the white uniformity. Then, the white uniformity of the display on the color cathode-ray tube is quantitatively evaluated on the basis of the previous experimental, visually evauated relation between the individual parameters and the results of visual evaluation of the white uniformity.

5 Claims, 9 Drawing Sheets

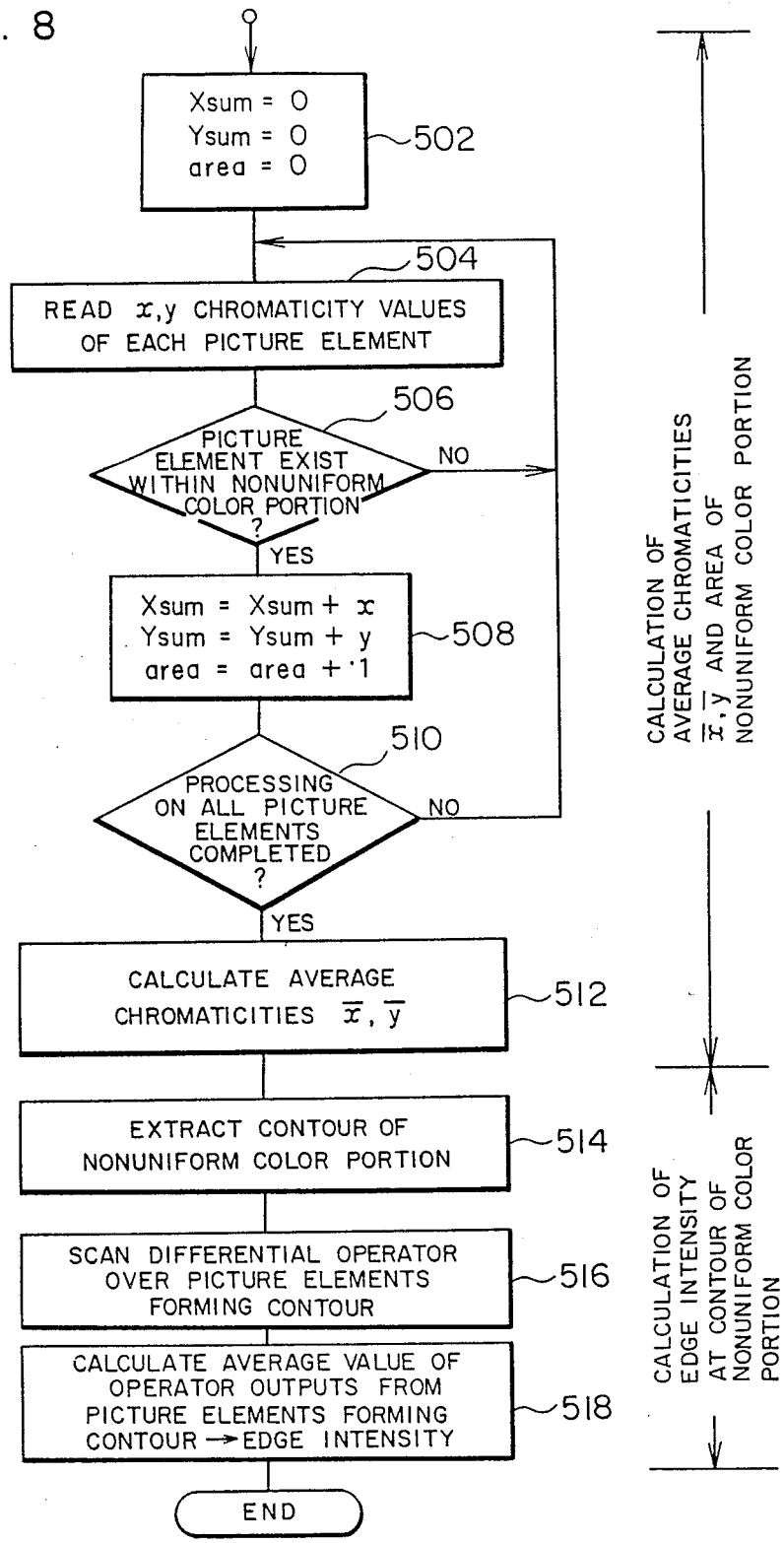

FIG. 9
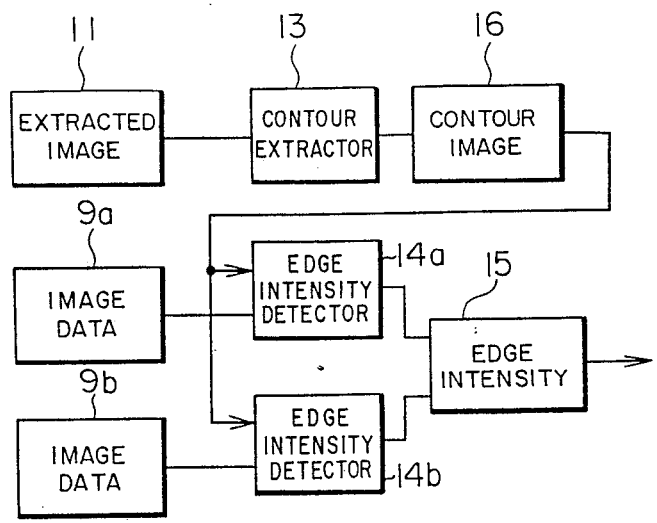
FIG. 10A
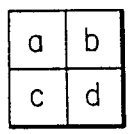
FIG. 10B
FIG. 10C    FIG. 10D
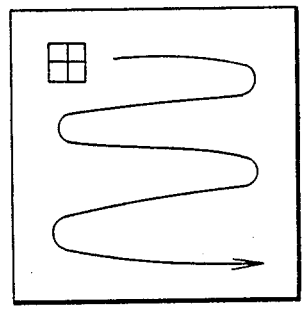

FIG. IIA    FIG. IIB
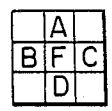
F = |A−D| + |B−C|
FIG. 12A
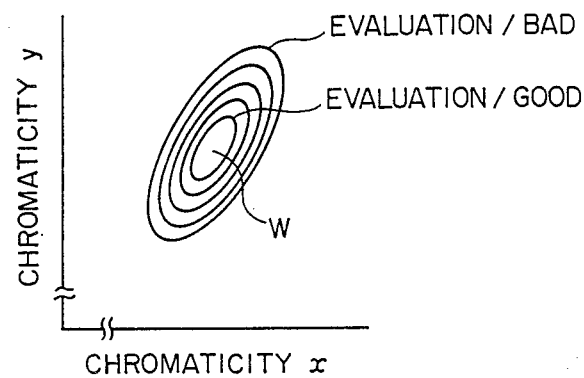
FIG. 12B    FIG. 12C
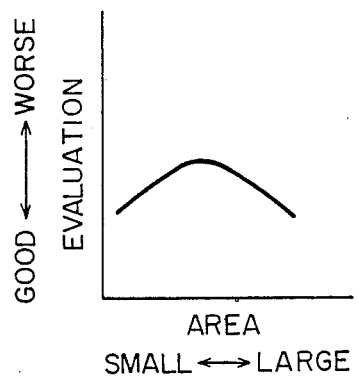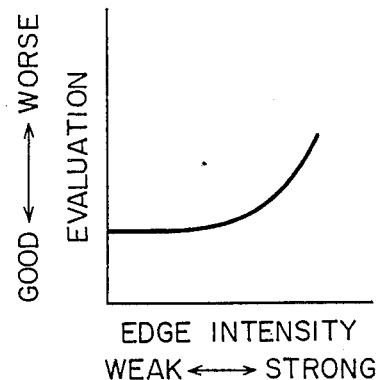

PICTURE QUALITY TESTING METHOD AND APPARATUS FOR COLOR CATHODE-RAY TUBE

BACKGROUND OF THE INVENTION

This invention relates to a method and apparatus for testing the quality of a picture displayed on a color cathode-ray tube, and more particularly to a method and apparatus suitable for automated evaluation of white uniformity of a white display.

Many items are now tested after assembling of color cathode-ray tubes and also after assembling of television sets. The testing of these items is broadly classified into testing of electrical characteristics and testing of picture quality. Automation of the process for testing the electrical characteristics is not so difficult and has already been increasingly put into practice at the site of manufacture of the color picture tubes. On the other hand, the testing of the picture quality is based on a visual inspection of an inspector who looks at a displayed picture to evaluate the quality of the picture. Thus, it is the present status of the art that the visual inspection by an inspector for evaluation of the picture quality is resorted to even in a modern manufacturing line in which almost all of the manufacturing steps have been automated. Therefore, automation of the visual inspection for evaluation of the picture quality is strongly demanded so as to decrease the man-hours required for the visual inspection and to establish a physical and quantitative testing method for evaluation thereby improving the accuracy and reliability of the picture quality inspection.

Among various items of such a visual inspection, evaluation of white uniformity is an item in which the subjective point of view of the inspector is especially strongly manifested. In a practical method for testing the picture quality, a white raster signal generated from a television signal generator is applied to a color cathode-ray tube to be tested, thereby displaying a white picture on the display screen of the color cathode-ray tube. The displayed white picture must ideally be uniformly white throughout the display screen. However, light-colored portions, which are not perfectly white, appear in the displayed white picture, because phosphor dots generating somewhat abnormal luminescence are still present even after the process of adjustment of convergence and landing of electron beams. Such a phenomenon is called "color nonuniformity" herein. An inspector evaluates the degree of this color nonuniformity while observing the white picture and expresses the degree of color nonuniformity in terms of a numerical value called the "white uniformity grade" or briefly "grade". For example, the larger the numerical value, the higher the degree of color nonuniformity.

The color of nonuniform color portions as described above is very light. The result of observation of the color nonuniformity differs depending on the difference between individual inspectors, physical conditions of inspectors, etc. Further, the nonuniform color portions described above appear in various modes. For example, nonuniform color portions having a great variety of tones, color vividness, shapes and sizes appear in the white picture at a variety of positions, and the number of the nonuniform color portions is very large. Thus, the subjective element occupies a greater proportion of the visual evaluation of the white uniformity when compared to the other items of the visual inspection.

Several attempts were made in the past for the purpose of automation of the evaluation of the white uniformity. For example, JP-A-59-75766 discloses a method for quantitative evaluation of the white uniformity in which an image of a picture displayed on a color cathode-ray tube is derived by the use of three primary color filters and a black-and-white television camera and is then binarized, so as to decide whether or not the ratio between the numbers of white and black picture elements is uniform throughout the picture displayed on the color cathode-ray tube.

However, in the prior art method disclosed in the publication cited above, a monochromatic screen such as red, green or blue is used independently, and the physical state of luminescence distribution on the display screen of the color cathode-ray tube is digitized to decide whether the white uniformity is good or bad. Thus, the prior art method was not intended to evaluate the grade of color nonuniformity by extracting the portions exhibiting the color nonuniformity on the white screen where the non-white color portion exists.

SUMMARY OF THE INVENTION

It is an object of the present invention to provide a testing method and apparatus for quantitative evaluation of the quality of a picture by making automated evaluation of white uniformity similar in tendency to the prior art visual evaluation of white uniformity.

Another object of the present invention is to provide a picture quality testing method and apparatus which can accurately measure the chromaticity of a picture displayed on the display screen of a color cathode-ray tube.

The method of the present invention which attains the above objects comprises a step of calculating feature parameters affecting a visually evaluated value on the basis of data indicating the color distribution in a nonwhite portion of a white picture and a step of estimating the visually evaluated value on the basis of the calculated feature parameters.

The feature parameters used in the present invention include the hue, saturation and area of a nonuniform color portion and the degree of change in the saturation at the marginal edge contour of the nonuniform color portion. (The indistinctness of the marginal edge contour of the nonuniform color portion depends on the degree of change in the saturation at the marginal edge contour of that portion.) The feature parameters are determined on the basis of the results of experimental visual evaluation of a picture displayed on a cathode-ray tube used as a sample, and the relation between the feature parameters and the visually evaluated value is also based on the results of the same experiment.

The degree of change in the saturation at the marginal edge contour of a nonuniform color portion will be referred to hereinafter as an edge intensity.

The method of the present invention intends to provide evaluation reflecting the visual sensation of human eyes, and such evaluation can be effected by carrying out an adequate procedure based on the results of an experiment conducted for evaluating the white uniformity. More concretely, in the method of the present invention, a roughly evaluated white uniformity grade of a nonuniform color portion is first calculated on the basis of the hue and saturation. This reflects the experimental fact that the color nonuniformity is more conspicuous when the color is more vivid, and that the conspicuousness of the color nonuniformity differs depending on the hue. For example, magenta and green are conspicuous, whereas blue and yellow are not so conspicuous. In the method of the present invention, the effects of the area and edge intensity of the nonuniform color portion are then considered. The effect of the area is such that, with an increase in the value of the area, the result of evaluation is negative, but, when the area exceeds a certain limit, the result of evaluation becomes positive.

This reflects the fact that, when the saturation is low and the area of the nonuniform color portion is considerably large, the nonuniform color portion is generally sensed rather uniform in color to the human eyes.

The effect of the edge intensity of the nonuniform color portion is such that the result of evaluation negative when the edge intensity is very large. That is, even a light color is sensed conspicuous when the marginal edge contour of the nonuniform color portion is quite distinct.

How an evaluated value of white uniformity is affected by the feature parameters described above and is experimentally detected, and the results of detection are referenced to obtain an evaluated value of white uniformity matching well with the visual sensation of the human eyes.

BRIEF DESCRIPTION OF THE DRAWINGS

FIG. 8 is a flow chart showing the details of the feature quantity calculation step shown in FIG. 1.

FIG. 9 is a block diagram showing the structure of a device for calculating the edge intensity of the nonuniform color portion.

FIGS. 10A, 10B, 10C and 10D illustrate an operator for extracting the marginal edge contour of the nonuniform color portion and the operation of the operator.

FIGS. 11A and 11B illustrate an operator for detecting the edge intensity and the output of the operator respectively.

FIGS. 12A, 12B and 12C illustrate how a visually evaluated value is affected by feature parameters.

DESCRIPTION OF THE PREFERRED EMBODIMENTS

The structure of a preferred embodiment of the picture quality testing apparatus according to the present invention will be described first with reference to FIG. 2.

Figure 2:
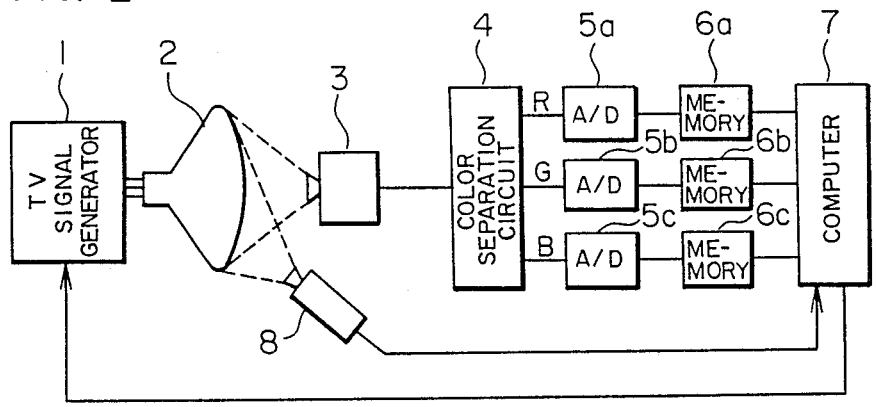
FIG. 2 is a block diagram showing the structure of an embodiment of the picture quality testing apparatus according to the present invention.

Referring to FIG. 2, a television (TV) signal generator 1 generates a white raster signal required for picture quality testing. The generator 1 also generates a plurality of kinds of calibration-purpose color signals required for calibration of color data. A color cathode-ray tube 2 to be tested is connected to the TV signal generator 1. In the case of automated evaluation of white uniformity, the white raster signal is applied from the TV signal generator 1 to display a white raster on the display screen of the color cathode-ray tube 2. On the other hand, in the case of preparation of color data for the purpose of calibration, rasters of different colors respectively are displayed on the display screen of the color cathode-ray tube 2. A color television camera 3 is used to measure white raster screen for automatically evaluating white uniformity and also to measure each color raster screen for preparation of color data calibration. A color picture signal generated from the TV camera 3 is separated by a color separation circuit 4 into three primary color signals R (red), G (green) and B (blue). The three primary color output signals R, G and B from the color separation circuit 4 are sampled and quantized by A/D converters 5a, 5b and 5c respectively, and the output signals of the A/D converters 5a, 5b and 5c are stored as planarly distributed digital values in image memories 6a, 6b and 6c respectively. A computer 7 is connected to the image memories 6a, 6b and 6c so as to automatically calculate an evaluated value on the basis of the image data of R, G and B. A reference-purpose colorimeter 8 is provided for the purpose of color data calibration.

The manner of quantitative evaluation by data processing by the computer 7 shown in FIG. 2 will now be described.

Figure 1:
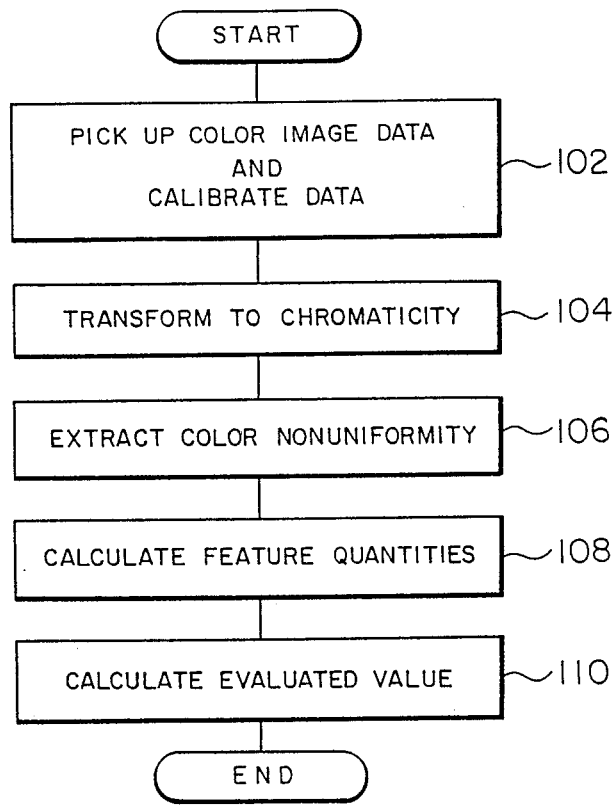
FIG. 1 is a flow chart showing an outline of the steps of quantitative evaluation carried out in an embodiment of the picture quality testing method according to the present invention.

FIG. 1 is a flow chart showing an outline of the steps of quantitative evaluation carried out in an embodiment of the method according to the present invention. First, in a step 102 in FIG. 1, the luminescent state of the fluorescent screen of the color cathode-ray tube 2 to be tested, on which a white raster is now displayed, is detected as three primary color image data R, G and B by the apparatus shown in FIG. 2. Also, when required, these color image data are calibrated in this step 102 by chromaticity data measured by the reference-purpose chromaticity meter 8. Then, in a step 104, the three primary color image data are subjected to chromaticity transformation to obtain x y chromaticity data of the image. Then, in a step 106, a nonuniform color portion which is observed relatively conspicuous is extracted.

Then, in a step 108, feature quantities are calculated. That is, the average chromaticity, area and edge intensity of the extracted nonuniform color portion are calculated. Finally, in a step 110, an evaluated value of white uniformity is calculated.

The details of processing in the individual steps 102 to 110 shown in FIG. 1 will now be described.

First, the calibration of the three primary color image data R, G and B obtained by the use of the color TV camera 3 will be described in detail.

The initial values of the three primary color image data R, G and B observed by the color TV camera 3 are expressed in terms of vector as $|r_{obs}{}^o{}'(r_{obs}, g_{obs}, b_{obs})$. Also, the calibrated values of R, G and B are expressed in terms of vector as $|r_{cal}{}^o{}'(r_{cal}, g_{cal}, b_{cal})$. In the method of the present invention, it is supposed that there is the following relation between $|r_{obs}$ and $|r_{cal}$.

$$|r_{cal} = A |r_{obs} + |b \qquad (1)$$

where A is a constant matrix and $|b$ is a constant vector.

The calibration according to the equation (1) is made for each of the picture elements. The basic principle of calibration of color data according to the equation (1) will now be described in detail.

Before describing the present invention in detail, the theoretical background will be described.

Suppose that the input-output characteristic of the circuit of the color TV camera 3 generating measured values is linear. When the real values and measured values are represented by $|r_{re} = (= {}'(r_{re}, g_{re}, b_{re}))$ and $_{obs}(= {}'(r_{obs}, g_{obs}, b_{obs}))$ respectively, the following relation holds:

$$|r_{re} = A |r_{obs} + |b \qquad (2)$$

Therefore, when the values of A and $|b$ are determined, the real value $|r_{re}$ can be calculated on the basis of the value of $|r_{obs}$.

tion between $|r_{re}$ and $|r_{obs}$:

Suppose then a case where spectra of the three primary colors measured by the color TV camera 3 are not equal to the standard CIE-distribution coefficients or a case where the input-output characteristic of the circuit of the color TV camera 3 is nonlinear. In such a case, it is considered that there is generally the following relation between $_{re}$ and $_{obs}$:

$$|r_{re} = |r_{re}(|r_{obs}) \qquad (3)$$

Taylor's expansion of the equation (3) around a point $|r_{obs}{}^o$ provides the following equation $$|r_{re} = |r_{re}{}^o + \frac{D(|r_{re})}{D(|r_{obs})}(|r_{obs}{}^o) + R \qquad (4)$$

where $$|r^o{}_{re} = |r_{re}(|r_{obs}{}^o)$$

$$\frac{D(|r_{re})}{D(|r_{obs})} = \begin{bmatrix} \text{grad } r_{re} \\ \text{grad } g_{re} \\ \text{grad } b_{re} \end{bmatrix}$$

$$\left( \text{grad } f = \frac{\partial f}{\partial r_{obs}} \quad \frac{\partial f}{\partial g_{obs}} \quad \frac{\partial f}{\partial b_{obs}} \right)$$

R represents a term higher than and including the second order.

If this term R is negligible, the equation (4) can be expressed as follows:

$$|r_{re} \approx |r_{re}{}^o + \frac{D(|r_{re})}{D(|r_{obs})}(|r_{obs} - |r_{obs}{}^o) \qquad (5)$$
$$= A |r_{obs} + |b$$

where $$A = \frac{D(|r_{re})}{D(|r_{obs})}$$

$$|b = |r^o{}_{re} - A |r^o{}_{obs}$$

Thus, when the color region to be measured is divided into small regions where R is negligible, and the calibration is effected in each of the divided regions so as to determine A and $|b$, the value of $|b_{cal}$ measured by the reference-purpose chromaticity meter 8 can be calculated in each region according to the equation (5) to provide an approximated value of $|b_{re}$.

How to calcuate A and $|b$ will now be described. As described already, it is assukmed that the following linear function holds between $|b_{obs}$ and $|b_{cal}$ $(= {}'(r_{cal}, g_{cal}, b_{cal}))$:

$$|r_{cal} = A |r_{obs} + |b \qquad (6)$$

where A represents a matrix of three rows and three columns, and $|b$ represents a column vector of three rows.

Figure 3:
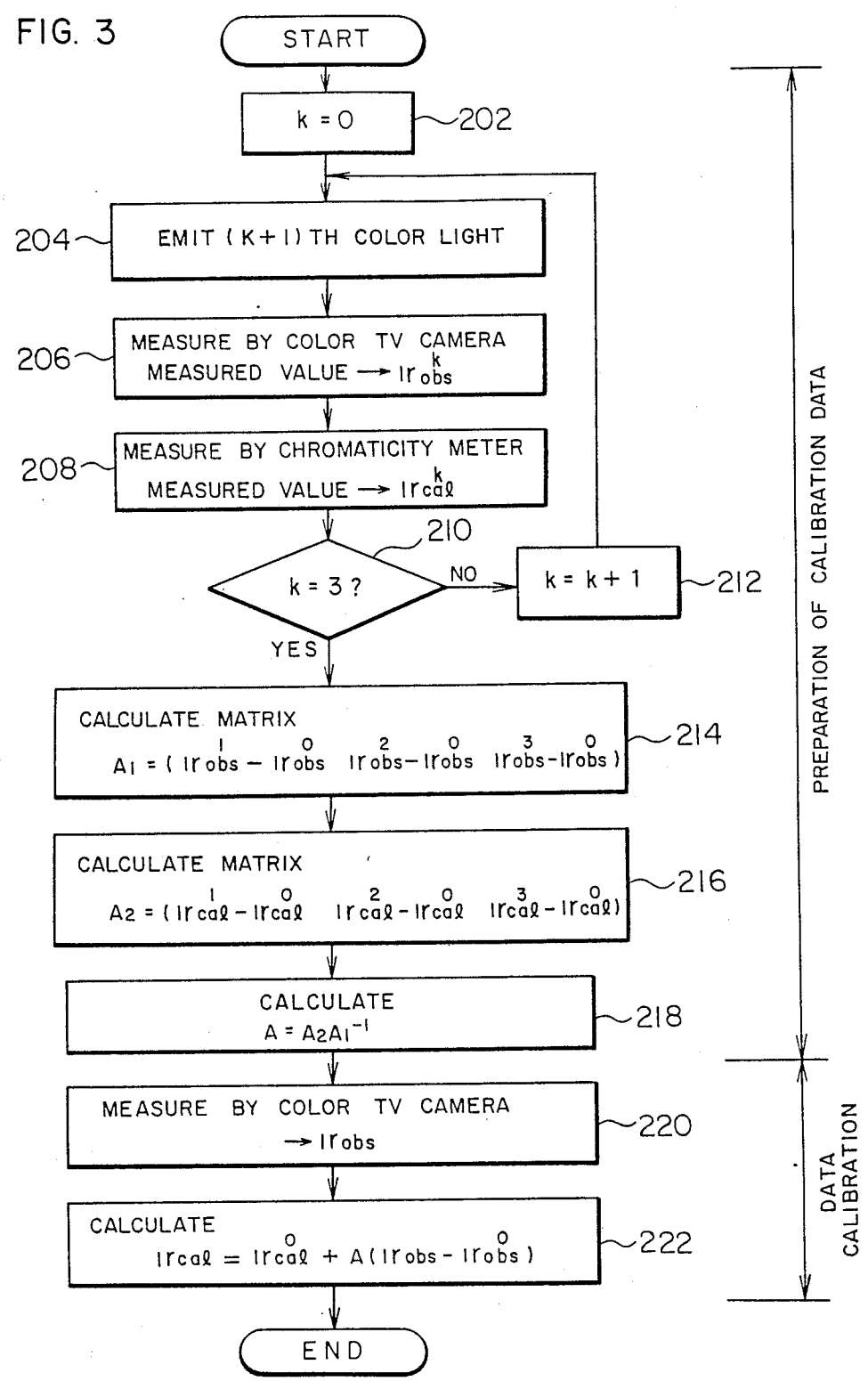
FIG. 3 is a flow chart showing in detail the steps for measuring the chromaticity of a picture displayed on a color cathode-ray tube.

FIG. 3 is a flow chart showing the steps of calculation of A and $|b$. In the steps of "preparation of calibration data" in FIG. 3, the computer 7 shown in FIG. 2 instructs the TV signal generator 1 to generate a color TV signal so that at least four kinds of colors required for measurement can be displayed on the display screen of the color cathode-ray tube 1. Then, the chromaticity of each of the displayed colors is measured at the same time by both the color TV camera 3 and the reference-purpose chromaticity meter 8, and the values of A and are calculated on the basis of the relation between the measured chromaticities. (When the white uniformity is to be evaluated, the TV camera signal generator 1 generates a white raster signal to display a white raster on the display screen of the color cathode-ray tube 2.)

When, for example, four kinds of colors are measured, to provide measured values $|r_{obs}{}^k$ (k = 0, 1, 2, 3), the following relation holds between $|r_{obs}{}^k$ and $|r_{cal}{}^k$ (k = 0, 1, 2, 3):

$$|r_{cal}{}^k = A |r_{obs}{}^k + |b \qquad (7)$$

Therefore, the values of A and $|b$ can be calculated according to the equation (7) as follows:

$$A = (|r_{cal}{}^1 - |r_{cal}{}^0 \; |r_{cal}{}^2 - |r_{cal}{}^0 \; |r_{cal}{}^3 - |r_{cal}{}^0)$$
$$\times (|r_{obs}{}^1 - |r_{obs}{}^0 \; |r_{obs}{}^2 - |r_{obs}{}^0 \; |r_{obs}{}^3 - |r_{obs}{}^0)^{-1} \qquad (8)$$

$$|b = |r_{cal}{}^0 - A |r_{obs}{}^0 \qquad (9)$$

In the flow chart of FIG. 3, the aforementioned steps (202 to 218) of "preparation of calibration data" are followed by steps (220 to 222) of "data calibration".

In this case, the coefficients of the terms of zeroth and first orders of the calibration-purpose linear function corresponding to the desired color region are calculated by processing in the steps of "preparation of calibration data." Then, by processing in the steps of "data calibration", the calibrated value is obtained on the basis of the values measured by the color TV camera 3 and the calibration-purpose linear function.

In the case of the present invention, the coefficients of the terms of zeroth and first orders in the calibration-purpose linear function are calculated by measuring the chromaticity of each of the four kinds of colors (k=0, 1, 2, 3).

In the present invention, the steps (202 to 218) of "preparation of calibration data" are executed prior to acquisition of data for testing the white uniformity.

In the chromaticity transformation step 104 shown in FIG. 1, the calibrated three primary color image data of R, G and B are based to calculate the xy chromaticity data of the image. This chromaticity transformation step 104 will now be described in detail. In this chromaticity transformation step, the following transformation is made on the values of RGB calibrated for each of the picture elements:

$$\begin{pmatrix} X \\ Y \\ Z \end{pmatrix} = \begin{pmatrix} m_{11} & m_{12} & m_{13} \\ m_{21} & m_{22} & m_{23} \\ m_{31} & m_{32} & m_{33} \end{pmatrix} \begin{pmatrix} R \\ G \\ B \end{pmatrix} \quad (10)$$

$$\left. \begin{array}{l} x = \dfrac{X}{X + Y + Z} \\ y = \dfrac{Y}{X + Y + Z} \end{array} \right\} \quad (11)$$

The symbols X, Y and Z in the equation (10) represent the primary color stimulus values in the XYZ colorimetric system specified by CIE (Commission Internationale de Elclairage), and $m_{ij}$ (i=1, 2, 3; j=1, 2, 3) represents a matrix of coefficients determining the relation between RGB and XYZ. When RGB represents the values of three primary color output signals according to the NTSC standards, the value of $m_{ij}$ is as follows:

$$(m_{ij}) = \begin{pmatrix} 0.607 & 0.174 & 0.201 \\ 0.299 & 0.587 & 0.114 \\ 0 & 0.066 & 1.117 \end{pmatrix} \quad (12)$$

Figure 4A:
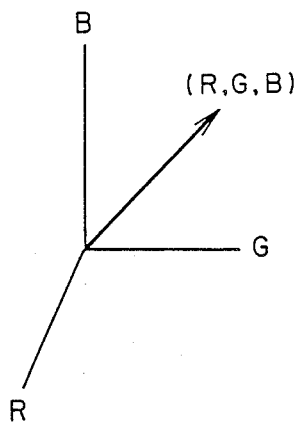
FIGS. 4A, 4B and 4C are diagrammatic views for illustrating the concept of chromaticity transformation in the present invention.
Figure 4B:
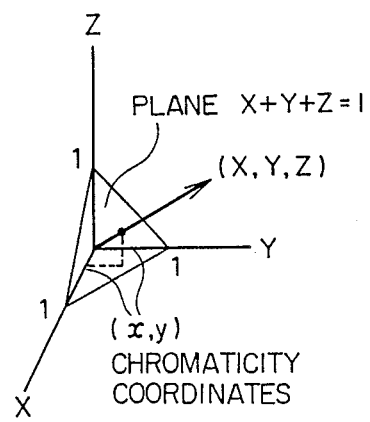
Figure 4C:
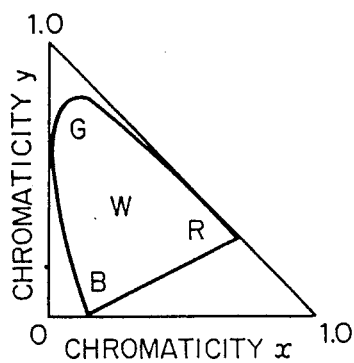

FIGS. 4A to 4C illustrate an example of chromaticity transformation according to the equations (10) and (11). FIG. 4A is a vector representation of three primary color values (R, G, B) of a color in the RGB coordinate system. FIG. 4B shows the vector (X, Y, Z) obtained after the linear transformation (10) determined by the coefficient matrix (12) is applied to this color. The X and Y coordinates at the intersection between this vector (X, Y, Z) and a plane given by $$X+Y+Z=1 \quad (13)$$

provide the values of xy chromaticities. The result of chromaticity transformation is shown in FIG. 4C which shows the xy chromaticity values of the three primary colors R, G and B. The symbol W represents white.

Figure 5:
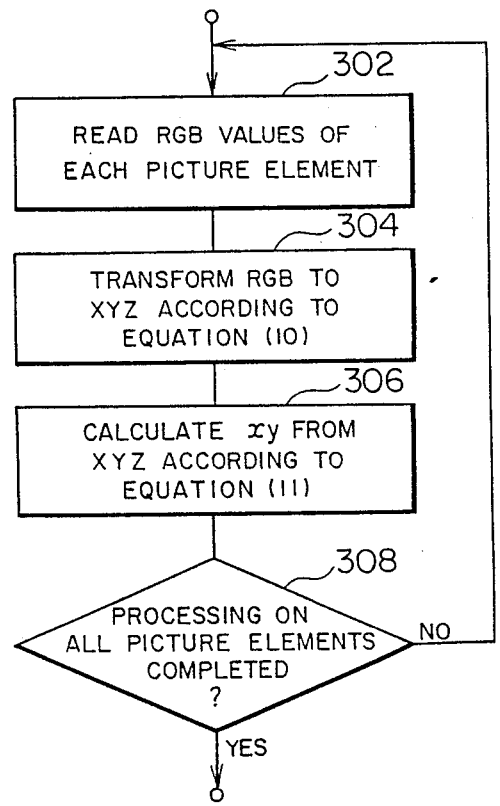
FIG. 5 is a flow chart showing the details of the chromaticity transformation step shown in FIG. 1.

FIG. 5 is a flow chart showing details of the chromaticity transformation step 102 shown in FIG. 1.

In a step 302 in FIG. 5, the values of RGB detected for each picture element and stored in the image memories 6a, 6b and 6c are read out and supplied to the computer 7. In a step 304, the chromaticity transformation from RGB to XYZ according to the equation (10) is executed. Then, in a step 306, the xy chromaticity values are calculated according to the equation (11) on the basis of the values of X, Y and Z. Finally, in a step 308, decision is made as to whether or not the above manner of processing has been executed for all the picture elements.

Figure 6:
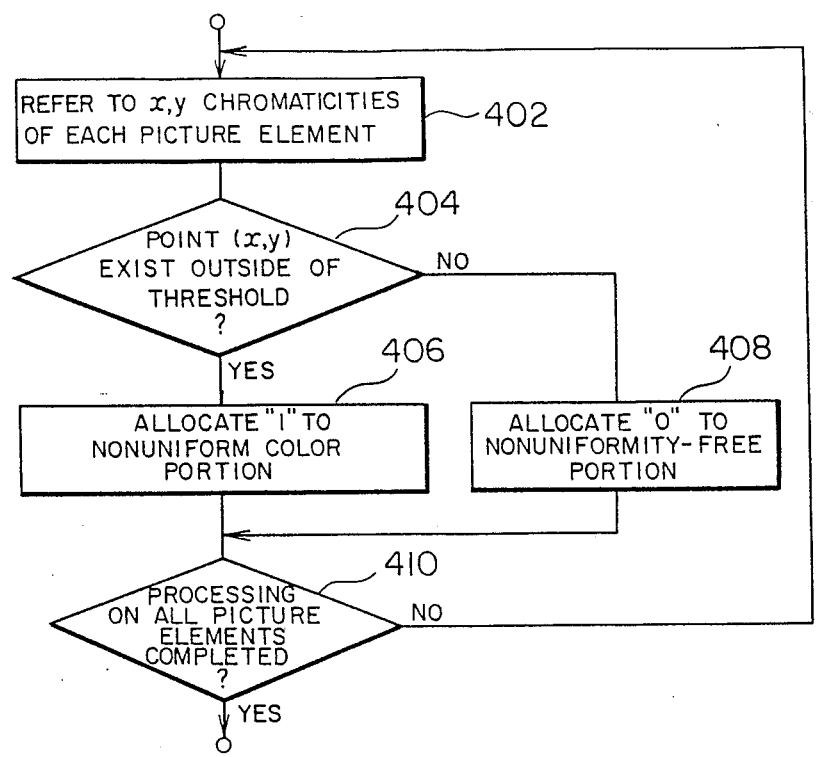
FIG. 6 is a flow chart showing the details of the nonuniform color portion extraction step shown in FIG. 1.

FIG. 6 is a flow chart showing details of the color nonuniformity extraction step 106 shown in FIG. 1.

First, in a step 402 in FIG. 6, reference is made to the xy chromaticity values calculated for each picture element by the chromaticity transformation steps described above. Then, in a step 404, decision is made as to whether or not the point (x, y) lies outside of a chromaticity threshold 12 described later. When the result of decision proves that the point (x, y) lies outside the threshold 12, the computer 7 decides in a step 406 that the corresponding picture element is included in a nonuniform color portion, and a "1" is allocated to such a picture element On the other hand, when the result of decision is "NO", the computer 7 decides in a step 408 that the corresponding picture element is not included in the nonuniform color portion, and a "0" is allocated to such a picture element. Finally, in a step 410, decision is made as to whether or not the above manner of processing has been executed for all the picture elements. By the above manner of processing, a nonuniform color portion is extracted from the xy chromaticity image data obtained by the chromaticity transformation.

Figure 7A:
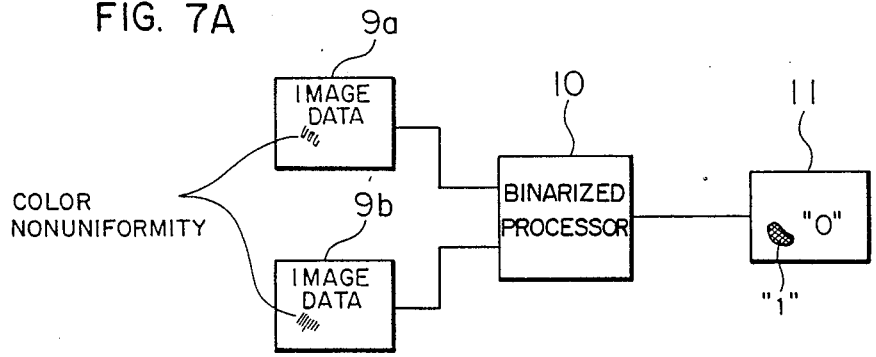
FIGS. 7A and 7B are a block diagram and a diagrammatic view respectively showing the structure and operation of a device for executing the nonuniform color portion extraction step shown in FIG. 1.
Figure 7B:
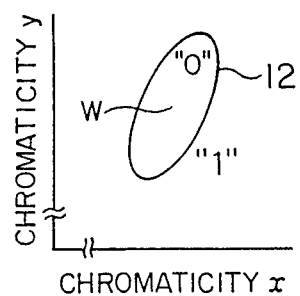

This extraction of a nonuniform color portion from the xy chromaticity image data will be described with reference to FIG. 7A. In FIG. 7A, 9a and 9b designate image data having chromaticity x and image data having chromaticity y respectively. The xy chromaticity values of each of the picture elements are calculated according to the aforementioned equations (10) and (11) on the basis of the RGB, values of the corresponding picture element. A binarized processer 10 functions to extract an image portion which is felt as a nonuniform color portion by the human eyes. (This function corresponds to the step 404 shown in FIG. 6.) It is experimentally taught that a specific ellipse having a center W on the xy coordinate system as shown in FIG. 7B is preferably used as the threshold 12 between a "0" and a "1". The symbol W represents the average of xy chromaticity values observed on an entire image. This ellipse manifests such a specific characteristic of human eyes that the human eyes are sensitive to red and green colors but not so sensitive to yellow and blue colors. When a "0" is allocated to picture elements having a chromaticity value lying within this ellipse, while a "1" is allocated to those having a chromaticity value lying outside this ellipse, a binarized image 11 as shown in FIG. 7A is obtained. In the image 11, the extracted nonuniform color portion is designated by a "1", and the remaining portion free from color nonuniformity is designated by a "0".

FIG. 8 is a flow chart showing details of the feature quantity calculation step 108 shown in FIG. 1.

The flow chart shown in FIG. 8 is broadly divided into two parts. In the first part of the flow chart, the average chromaticity values $\bar{x}$, $\bar{y}$ and area of the nonuniform color portion designated by "1" in the binary coded image 11 shown in FIG. 7A are calculated. That is, in steps 504 to 510, the area of the noted nonuniform color portion is calculated by counting the number of picture elements to which a "1" is allocated, and the sums of the respective chromaticity values x and y of those picture elements are calculated. Then, in a step 512, the calculated sums are divided by the calculated area to calculate the average chromaticity values $\bar{x}$ and $\bar{y}$ respectively.

In the second part of the flow chart, the edge intensity at the marginal edge contour of the nonuniform color portion is calculated. That is, in a step 514, the marginal edge contour of the nonuniform color portion designated by "1" on the binary coded image 11 is extracted, and, in a step 516, a differential operator is scanned over the picture elements forming the marginal edge contour of the nonuniform color portion to calculate the intensity of changing saturation. Finally, in a step 518, the resultant output values are averaged to calculate the edge intensity.

FIG. 9 is a block diagram of a device for calculating the edge intensity by the manner of processing described above.

The blocks 9a, 9b and 11 shown in FIG. 9 are the same as those shown in FIG. 7A respectively. Referring to FIG. 9, a color nonuniformity contour extractor 13 extracts the marginal edge contour of the extracted nonuniform color portion in the binary coded image 11. The operating principle of the color nonuniformity contour extractor 13 will be described with reference to FIGS. 10A to 10D. In the contour extractor 13, a 2×2 operator as shown in FIG. 10A is scanned over the entire area of the binary coded image 11 which includes the extracted nonuniform color portion. As a result of scanning over all the picture elements with such an operator as shown in FIG. 10B and calculating the results of scanning, an extracted color nonuniformity contour image 16 is obtained. Depending on the values of a, b, c and d of the operator shown in FIG. 10A, the output is expressed as follows:

$$(a \oplus d) + (b \oplus c) \tag{14}$$

where the symbols $\oplus$ and $+$ designate exclusive-OR and OR respectively.

FIG. 10C shows an example of the binary coded image 11 which includes the extracted nonuniform color portion in which the picture elements are designated by "1". Thus, when the operator shown in FIG. 10A is scanned over the image 11, an extracted color nonuniformity contour image 16 as shown in FIG. 10D is obtained.

Edge intensity detectors 14a and 14b shown in FIG. 9 detect and calculate edge intensities of the picture elements having the chromaticities x and y respectively at the marginal edge contour of the nonuniform color portion. The operation of the edge intensity detectors 14A and 14B will be described with reference to FIGS. 11A and 11B. FIG. 11A shows an operator which is scanned over each of the chromaticity images 9a and 9b. The data of the extracted color nonuniformity contour image 16 is supplied to each of the edge intensity detectors 14a and 14b. The operator shown in FIG. 11A is not scanned over the entire area of each of the chromaticity images 9a and 9b, but is scanned over the picture elements designated by "1" among all the picture elements of the extracted color nonuniformity contour image 16, that is, those picture elements representing the marginal edge contour of the nonuniform color portion.

The output F of the operator shown in FIG. 11A is expressed as $|A-D|+|B-C|$ as shown in FIG. 11B. This value F is obtained for each of the picture elements defining the marginal edge contour of the nonuniform color portion, and the total sum of those values is calculated. The quotient calculated by dividing the number of the contour-defining picture elements by the sum described above provides the edge intensity. The operator shown in FIG. 11A is used to detect a local rise of the edge intensity, and the value of the edge intensity described above provides an index showing relative sharpness of the edge of nonuniform color portion. Such a manner of processing is carried out to calculate the edge intensity of each of the xy chromaticity images 9a and 9b, and an edge intensity calculator 15 calculates the final edge intensity by taking the square root of the sum of the second powers of the edge intensities of the xy chromaticity images 9a and 9b.

Finally, the details of the step 110 of calculation of the evaluated value of white uniformity shown in FIG. 1 will be described with reference to FIGS. 12A to 12C, FIG. 13, FIGS. 14A, 14B, FIG. 15 and FIG. 16.

As described already, the evaluated value of white uniformity is roughly determined by the hue and saturation of the nonuniform color portion.

First, a plurality of isopleth curves representing different evaluated values are prepared so as to select the evaluated value, that is, the basic evaluated value corresponding to the average values $\bar{x}$ and $\bar{y}$ of the xy chromaticities calculated in the step 108 of feature quantity calculation. These isopleth curves are experimentally obtained.

Curves shown in FIGS. 12B and 12C represent the results of an experiment conducted to find how the evaluated value is affected by the area and edge intensity respectively of nonuniform color portions.

According to the curves shown in FIGS. 12B and 12C and on the basis of the calculated values of the area and edge intensity of the specific nonuniform color portion, an amount required for correcting the basic evaluated value is calculated.

Figure 13:
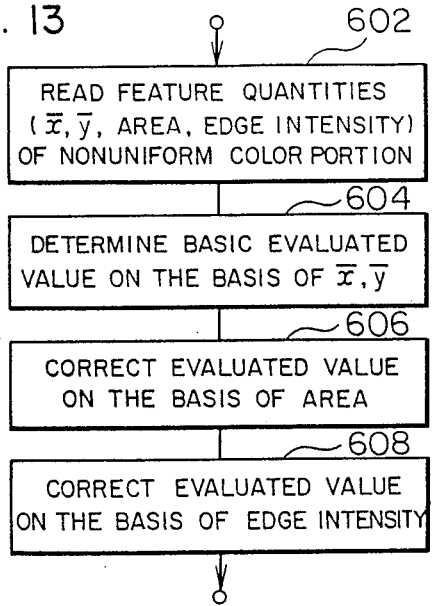
FIG. 13 is a flow chart showing the details of the evaluated value calculation step shown in FIG. 1.

FIG. 13 is a flow chart showing an outline of the steps of calculation of the finally evaluated value of white uniformity. In a step 602, the computer 7 reads the four kinds of feature quantities calculated in the step 108, that is, the average chromaticities $\bar{x}$, $\bar{y}$ and area of the nonuniform color portion and the degree of change in the saturation at the marginal edge contour of the nonuniform color portion, that is, the edge intensity. In a step 604, the average chromaticities $\bar{x}$ and $\bar{y}$ are based to determine the basic evaluated value. Then, in a step 606, the degree of the effect of the area on the evaluated value is determined to correspondingly correct the basic evaluated value. Then, in a step 608, the degree of the effect of the edge intensity on the evaluated value is determined to suitably correct the evaluated value corrected in the step 606.

Figure 14A:
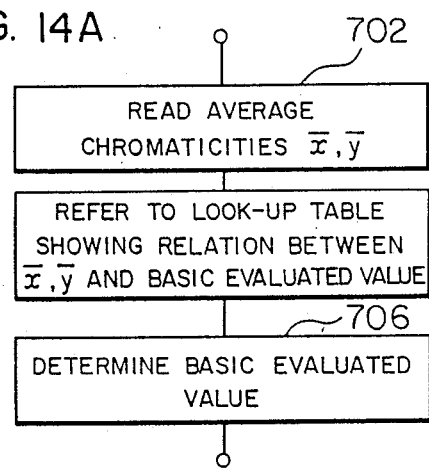
FIGS. 14A and 14B are flow charts showing different procedures respectively of the basic evaluated value determination step shown in FIG. 13.
Figure 14B:
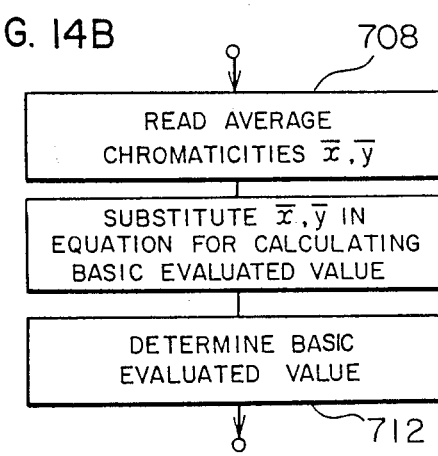

FIGS. 14A and 14B are two flow charts respectively showing modifications of the manner of calculation of the basic evaluated value on the basis of the average chromaticities $\bar{x}$ and $\bar{y}$. In the flow chart shown in FIG. 14A which includes steps 702, 704 and 706, a look-up table (LUT) is used so as to calculate the evaluated value corresponding to the given values of the average chromaticities $\bar{x}$ and $\bar{y}$. On the other hand, in the flow chart shown in FIG. 14B which includes steps 708, 710 and 712, the basic evaluated value is regarded as a function of two variables $\bar{x}$ and $\bar{y}$ so as to directly calcuate the evaluated value on the basis of the given values of $\bar{x}$ and $\bar{y}$. In each of these flow charts, the experimentally determined relation between the average chromaticities $\bar{x}$, $\bar{y}$ and the basic evaluated values as shown in FIG. 12A is expressed in the form of the look-up table or the function so as to calculate the evaluated value.

Figure 15:
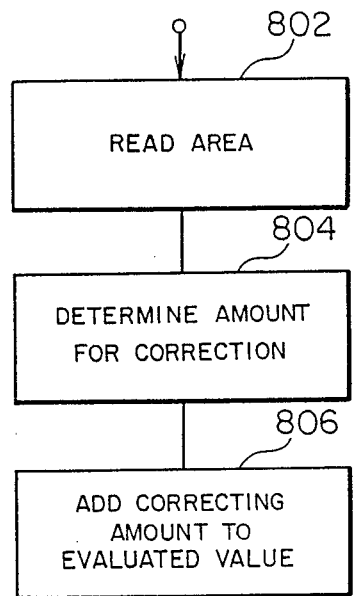
FIG. 15 is a flow chart showing the details of the step of correcting the evaluated value on the basis of the area, shown in FIG. 13.

FIG. 15 is a flow chart in which the effect of the area of the nonuniform color portion is taken into account for correction of the evaluated value. In a step 802, the value of the area of the nonuniform color portion is read. Then, in a step 804, a look-up table or a function similar to that used in the step 704 or 710 but representing the relation between the area and the evaluated value shown in FIG. 12B is utilized to determine an amount of correction required for the basic evaluated value. Then, in a step 806, the amount of correction determined in the step 804 is added to the basic evaluated value.

Figure 16:
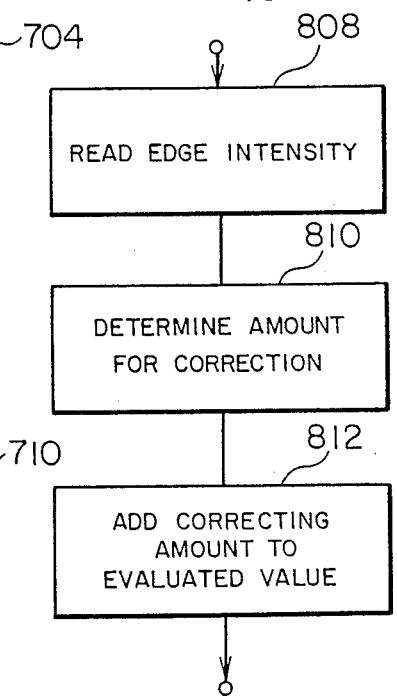
FIG. 16 is a flow chart showing the details of the step of correcting the evaluated value on the basis of the edge intensity, shown in FIG. 13.

FIG. 16 is a flow chart in which the effect of the edge intensity of the nonuniform color portion is taken into account for correction of the evaluated value. Steps 808, 810 and 812 are entirely similar to the steps 802, 804 and 806 respectively, except that a look-up table or a function based on FIG. 12C is used in the step 810.

By the method of the present invention described above, the finally evaluated value of white uniformity of a picture is automatically determined on the basis of the average chromaticities $\bar{x}$, $\bar{y}$, area and edge intensities of a nonuniform color portion.

Figure 17:
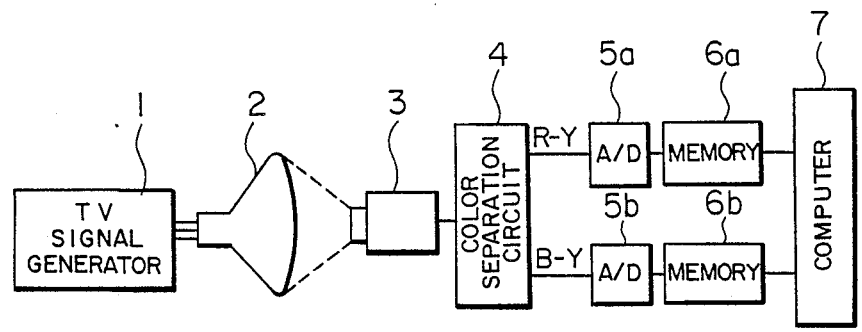
FIG. 17 is a block diagram showing the structure of another embodiment of the picture quality testing apparatus according to the present invention.
Figure 18:
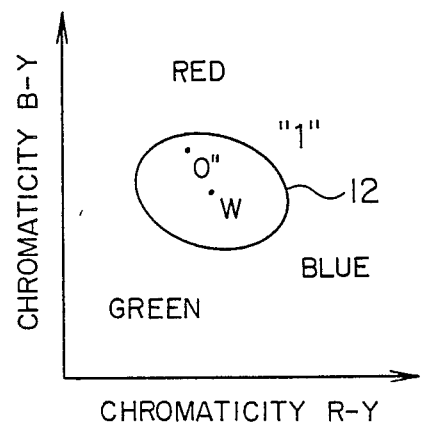
FIG. 18 is a diagrammatic view for illustrating the manner of extraction of a nonuniform color portion in the apparatus shown in FIG. 17.

In the foregoing description of the method and apparatus of the present invention, xy chromaticities that can be calculated from data of three primary colors R, G and B are used as chromaticity data. However, the chromaticity data may be based on color signals (R-Y and B-Y) called color difference signals extracted from a color video signal. FIG. 17 shows the structure of an apparatus in which the color difference signals R-Y and B-Y are used to provide the chromaticity data. In FIG. 17, like reference numerals are used to designate like parts appearing in FIG. 2. FIG. 18 shows a chromaticity diagram in which the chromaticity coordinates are the color difference signals R-Y and B-Y. FIG. 18 is similar to FIG. 7B in that a binary coded threshold 12 is used to extract a color nonuniformity image.

It will be understood from the foregoing detailed description that evaluation of white uniformity according to the present invention reflects experimentally detected results of correspondence between feature parameters of a nonuniform color portion and a visually evaluated value of the nonuniform color portion. Therefore, quantitative evaluation matching well with visual sensation of human eyes can be attained, thereby realizing automation of sensual inspection of white uniformity which has been impossible.

Further, according to the present invention, an area of a picture to be measured is suitably divided into smallest possible regions, and data measured in each of such regions is converted (corrected) into calibrated data by linear approximation. Therefore, calibration with high accuracy can be made in a broader range when compared to the prior art manner of calibration in which measured data is merely multiplied by a constant matrix.

We claim:

1. A method of testing the quality of a picture displayed on a color cathode-ray tube, comprising the steps of:
    extracting a nonuniform color portion from a color distribution of a picture displayed on the color cathode-ray tube;
    calculating quantities of features of said nonuniform color portion to use the feature quantities as parameters for evaluation of white uniformity; and
    quantitatively evaluating white uniformity of the picture displayed on the color cathode-ray tube on the basis of the relation between previously detected experimental values of the individual parameters and previously evaluated values of white uniformity, wherein the hue, saturation and area of said nonuniform color portion and a degree of change in the saturation at a marginal edge contour of said nonuniform color portion are used as said feature quantities of said nonuniform color portion.

2. A method of testing the quality of a picture displayed on a color cathode-ray tube, comprising the steps of:
    displaying a white raster on a phosphor screen of the color cathode-ray tube to be tested and deriving color image data from the phosphor screen;
    subjecting said color image data to chromaticity transformation for obtaining a chromaticity image including chromaticity image data;
    extracting a selected nonuniform color portion from said chromaticity image;
    calculating the average chromaticity, area and edge intensity of said extracted nonuniform color portion for calculating quantities of features of said nonuniform color portion; and
    calculating an evaluated value of white uniformity on the basis of said feature quantities.

3. An apparatus for testing the quality of a picture displayed on a color cathode-ray tube, comprising:
    a color television camera for picking up an image of white color displayed on said color cathode-ray tube;
    means for separating color signals from an output signal of said color television camera;
    means for converting said separated color signals into digital color signals;
    memory means for storing said digital color signals; and
    a computer for analyzing the contents of said memory means, said computer including means for extracting a nonuniform color portion from a color distribution of the display on said color cathode-ray tube, means for calculating quantities of features of said extracted nonuniform color portion, and means for calculating an evaluated value of white uniformity on the basis of said calculated feature quantities.

4. A picture quality testing apparatus according to claim 3, wherein said color signal separating means extracts color difference signals from the output signal of said color television camera.

5. A picture quality testing apparatus according to claim 3, wherein a reference-purpose chromaticity meter used for color data calibration is further provided to measure chromaticity data of the display on said color cathode-ray tube, and color data measured by said color television camera is calibrated by said computer by said chromaticity data measured by said chromaticity meter.

* * * * *